United States Patent
Marion

(10) Patent No.: US 8,252,363 B2
(45) Date of Patent: Aug. 28, 2012

(54) METHOD OF THINNING A BLOCK TRANSFERRED TO A SUBSTRATE

(75) Inventor: Francois Marion, Saint Martin le Vinoux (FR)

(73) Assignee: Commissariat à l'Energie Atomique, Paris (FR)

( * ) Notice: Subject to any disclaimer, the term of this patent is extended or adjusted under 35 U.S.C. 154(b) by 518 days.

(21) Appl. No.: 12/619,954

(22) Filed: Nov. 17, 2009

(65) Prior Publication Data

US 2010/0124604 A1   May 20, 2010

(30) Foreign Application Priority Data

Nov. 20, 2008   (FR) ...................................... 08 57897

(51) Int. Cl.
*B05D 5/12* (2006.01)

(52) U.S. Cl. ............................ 427/58; 438/694; 438/459

(58) Field of Classification Search .................. 427/58, 427/258, 264, 270, 271, 123; 428/694, 459, 428/757, 759, 760
See application file for complete search history.

(56) References Cited

U.S. PATENT DOCUMENTS

| | | | | |
|---|---|---|---|---|
| 5,262,346 A | * | 11/1993 | Bindal et al. | ................. 438/404 |
| 5,264,395 A | | 11/1993 | Bindal et al. | |
| 5,318,663 A | * | 6/1994 | Buti et al. | ..................... 438/404 |
| 5,646,053 A | | 7/1997 | Schepis et al. | |
| 2007/0259463 A1 | | 11/2007 | Abedini | |

FOREIGN PATENT DOCUMENTS

| | | |
|---|---|---|
| EP | 0224699 A2 | 6/1987 |
| EP | 1548836 A1 | 6/2005 |
| WO | WO-2006054005 A1 | 5/2006 |

OTHER PUBLICATIONS

Republique Francaise, Rapport De Recherche Preliminaire, dated Jun. 17, 2009, 2 pgs. in French language.

* cited by examiner

*Primary Examiner* — Michael Cleveland
*Assistant Examiner* — Tabassom Tadayyon Eslami

(57) ABSTRACT

The invention relates to a method of thinning a block transferred to a substrate. According to the invention, the method includes depositing a stop layer at least onto the substrate and in a way adjacent to and contiguous with the transferred block. The stop layer is made out of material of greater resistance or hardness than the material of the transferred block and of smaller thickness than that of the transferred block. The method further includes actuating the thinning of the transferred block. The thinning time is pre-programmed as a function of a predetermined speed of thinning the transferred block, the thinning time being selected so that the thinning also attacks the stop layer.

10 Claims, 2 Drawing Sheets

METHOD OF THINNING A BLOCK TRANSFERRED TO A SUBSTRATE

CROSS REFERENCE TO RELATED APPLICATIONS

This application claims priority under 35 U.S.C. §119 from French Patent Application No. 0857897 filed Nov. 20, 2008 in the French Patent Office, the entire disclosure of which is incorporated herein by reference.

FIELD OF THE INVENTION

The invention relates to the field of the manufacture of micro-electronic components, and more particularly to the thinning of micro-electronic components added to a substrate.

PRIOR ART

In some matrix detectors, the electromagnetic radiation detection function is performed by a matrix of sensitive elements added to a substrate that includes all the circuitry for reading said elements. Among such detectors may be cited for example those that are back lit ("backside" detector) or again, those that employ membrane-suspended bolometers. Such detectors are usually of hybridized design, for example using "flip-chip" techniques of hybridization by straightforward bonding or by insertion.

The components assembled ("transferred") to the substrate in this way are then thinned so that they can fulfill their detection function.

The mechanical thinning techniques of the prior art, such as polishing or lapping for example, are able to give final thicknesses of about 20 micrometers with high levels of accuracy. These techniques generally comprise repeating cycles of thinning the material over a given thickness, followed by an inspection of the thinning actually produced. However, to obtain thicknesses below 20 micrometers, a large number of cycles is required, as well as very accurate parallelism of the successive thinning operations. Generally speaking, mechanical thinning is not deemed to give good results when a residual thickness below 20 micrometers is required.

There are also techniques of thinning by chemical attack using stop layers. When manufacturing micro-electronic components for thinning, a so-called "stop" layer is inserted into each of them. Since this stop layer is insensitive to chemical attack as used to thin components, it allows effective thinning control. However inserting a stop layer inside the components for thinning makes them more complex and expensive to manufacture. Provision has to be made for example for steps to make specific depositions in ultra high vacuum when the components include II-VI or III-V compounds, to manufacture a $SiO_2$ stop layer for silicon components or again to insert highly doped specific layers.

DISCLOSURE OF THE INVENTION

The purpose of the present invention is to resolve the aforementioned problems by proposing a method of thinning components transferred to a substrate that allows very small residual thicknesses to be obtained with great accuracy, without this making the manufacture of the components for thinning more complex or resulting in a high cost.

To this end, the object of the invention is a method of thinning a block transferred to a substrate, which, according to the invention, comprises:

depositing, at least onto the substrate and in a way adjacent to and contiguous with said transferred block, a stop layer made out of a material of greater resistance or hardness than the material constituting the transferred block for thinning and of smaller thickness than that of said transferred block; and actuating the thinning of the transferred block.

According to one inventive embodiment, thinning stoppage is actuated when the thinning speed decreases.

In other words, a stop layer of great hardness is deposited onto the substrate and contiguously with the block for thinning. Thus, so long as the thinning is performed solely on the block, constituted by a less hard material, a thinning speed is observed, a speed which drops when the thinning reaches the stop layer, because of the greater hardness of said stop layer. This drop in speed then acts as a criterion for stopping the thinning. The block then has a residual thickness equal to that of the stop layer.

There is therefore no need to use a stop layer integrated into the block itself, whereof the greater complexity of implementation has been demonstrated, and the attainable thickness is in this case solely limited by the techniques for depositing the stop layer. An accuracy of thinning below one micrometer is thus possible.

According to the invention, the stop layer may be deposited by electrolysis or by electrolytic deposition or by straightforward deposition, such as evaporation, sputtering, chemical vapor deposition (CVD), or even plasma torch.

According to the invention, making the stop layer may comprise depositing a seed layer by sputtering or evaporation onto the substrate, followed by the electrolytic deposition onto the seed layer of a growth layer made out of a material of greater resistance or hardness than that of said transferred block.

The transferred block for thinning is for example made out of silicon, and the material of greater resistance or hardness of the stop layer is a hard metal, particularly chromium, nickel or copper, or an alloy thereof.

To advantage, the stop layer may comprise on its upper surface a layer made of diamond, silicon carbide or alumina.

Thinning may be performed by polishing or lapping.

According to one inventive embodiment, the thinning time is pre-programmed as a function of a predetermined speed of thinning the transferred block, the thinning time being selected so that the thinning also partially attacks the stop layer.

According to one inventive embodiment, the stop layer is also deposited onto the upper face of the transferred block, the method further comprising removing the stop layer portion deposited onto the upper face of the transferred block prior to actuation of the thinning of the transferred block.

According to one version of the invention, the transferred block is imbedded or coated prior to the deposition of the stop layer.

According to another inventive embodiment, the transferred block belongs to a matrix of blocks transferred to the substrate, the stop layer being deposited at least between the blocks of the matrix and the thinning being performed collectively on all the blocks in the matrix.

BRIEF DESCRIPTION OF THE FIGURES

The invention will be better understood from reading the following description, given solely by way of example, and given in relation to the appended drawings, wherein identical references denote identical or similar elements, and wherein.

DETAILED DESCRIPTION OF THE INVENTION

Figure 1:
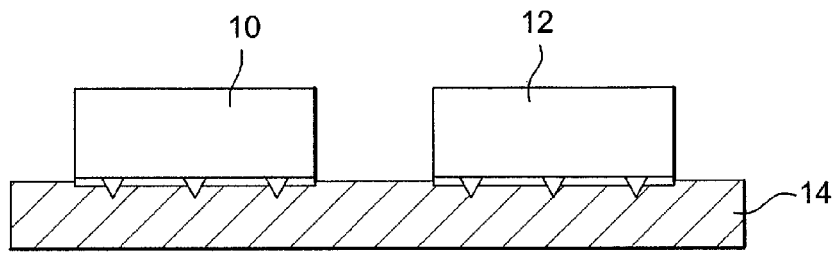
FIGS. 1 to 4 illustrate the general principle of the inventive method.

In FIG. 1, silicon blocks 10, 12 are assembled to a substrate 14, for example by "flip-chip" technology, by straightforward bonding, or by insertion of points after pre-coating as described in the application WO2006/054005, or any other technique allowing two heterogeneous units to be hybridized together.

Figure 2:
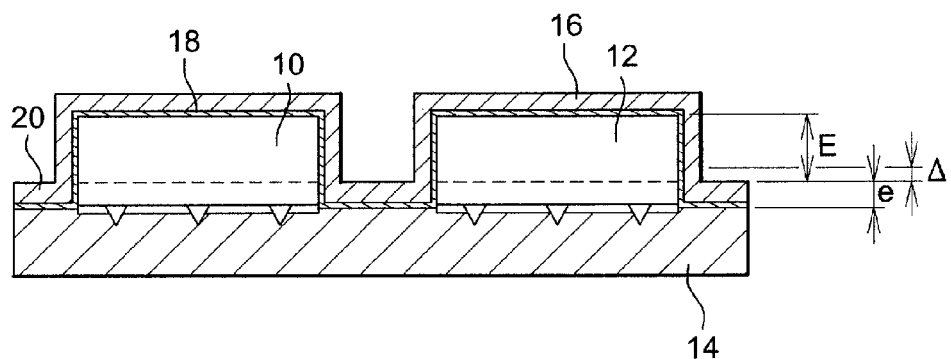

The inventive thinning method starts with the deposition of a stop layer 16 onto the upper face of the hybridized assembly, so as to cover the transferred blocks 10, 12 and the substrate 14 (FIG. 2). The stop layer 16 is of greater hardness than the material constituting the blocks 10, 12, and has a thickness e smaller than that of the blocks 10, 12.

The stop layer 16 is conventionally deposited by electrolysis or electrolytic deposition using known techniques. For example, the stop layer 16 is obtained by deposition of a first seed layer 18, followed by the electrolytic deposition of a growth layer 20.

The seed layer 18 is implemented in two phases. Firstly a bonding layer made of titanium, chromium or tungsten is deposited in a first phase by sputtering or evaporation, and then a layer of metal, such as gold, copper, platinum, or nickel (or any other material suitable for electrolysis) is deposited onto the bonding layer.

The growth layer 20 is for its part deposited electrolytically onto the seed layer 18, and is constituted by an electrolyzable material harder than that constituting the blocks 10, 12. When these are constituted by silicon, the growth layer 20 is preferentially constituted by chromium, nickel or copper.

The stop layer 16 may also be deposited by means of straightforward deposition, for example by means of evaporation, chemical vapor deposition, plasma-assisted chemical vapor deposition, sputtering or any conventional deposition on semi-conductor technique.

The stop layer 16 may also be deposited by a combination of these techniques. For example, the layer 16 is obtained by a first electrolytic deposition of a thick metal of average hardness, followed by a second straightforward deposition of a very hard layer such as diamond, silicon carbide or alumina for example.

Figure 3:
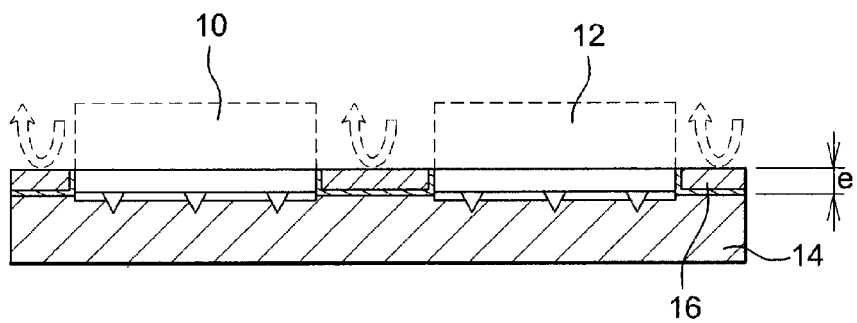

Once the stop layer 16 is deposited, the inventive method continues with the thinning of the transferred blocks 10, 12 (FIG. 3).

A mechanical thinning technique, such as lapping or polishing for example, is applied.

Once the stop layer portion 16 is removed from the upper face of the blocks 10, 12, the thinning continues in the thickness thereof. The thinning then has a speed of advance defined by the hardness of the material constituting the blocks.

Once the thinning reaches the upper face of the stop layer 16 deposited onto the substrate in a way adjacent to and contiguous with the block 10, 12, the hardness of the stop layer 16 leads to a drop in the thinning speed and the thinning is then stopped. The residual thickness of the blocks 10, 12 is thus, in this example, substantially equal to the thickness "e" of the stop layer 16.

In a first alternative, the stoppage of the thinning is pre-programmed. For example, when the thinning is implemented mechanically using a polishing device which includes a brush rotated by an electric motor, the thinning speed is known as a function of the type of materials for thinning and the polishing device settings. Thus, for example for a particular setting thereof, the speed "$V_{Si}$" of thinning the silicon constituting the blocks 10, 12 is known, as is the speed "$V_{Cr}$" of thinning the stop layer 16.

In a first phase, the polishing device is programmed so that it operates for "N" minutes with $$N = \frac{E - \Delta}{V_{Si}},$$

where:
"E" is the thickness to be removed from the blocks 10, 12, and "Δ" is a pre-determined thickness much below "E" (see FIG. 2).

Once this first thinning is finished, the residual thickness of the blocks 10, 12 is then close to the thickness of the stop layer 16.

In a second phase, the device is programmed with the same settings so that it operates for "M" minutes with $$M = \frac{\Delta + \delta}{V_{Si}},$$

an expression wherein denotes a pre-determined thickness much below "Δ". The polishing device thus removes the thickness "Δ" of the blocks 10, 12 and attacks the stop layer 16.

Given the difference in hardness between the material constituting the blocks 10, 12 and that of the stop layer 16, it is not an additional thickness "δ" which will be removed from the blocks 10, 12 during the "M" minutes of polishing, but a thickness $$\varepsilon = \delta \times \frac{V_{Cr}}{V_{Si}}$$

given that the device also attacks the stop layer 16.

Preferably, the stop layer is attacked over its entire thickness.

The advantage of programming a time corresponding to a thickness above "Δ" lies in the fact that the upper surface of the blocks 10, 12 will sustain uniform polishing, making them substantially smooth.

The accuracy of the thickness finally obtained therefore depends on the parameter "δ" and on the thinning selectivity characterized by the ratio $V_{Si}/V_{Cr}$. The thinning selectivity $V_{Si}/V_{Cr}$ is set by the choice of the materials(s) constituting the stop layer 16. For example with silicon blocks 10, 12 and a chromium stop layer 16, the selectivity is substantially equal to 10. By adding a diamond, silicon carbide or alumina film to the surface of the stop layer 16, the selectivity then rises to 100.

Thus considering that a prior art polishing device allows a "p" micrometer thinning accuracy when it is used on its own, this accuracy rises to $$p \times \frac{V_{Cr}}{V_{Si}}$$

through the use of the stop layer 16. An accuracy gain of ten, or even a hundred, is thus obtained while guaranteeing very smooth surfaces of the thinned blocks.

As a numerical example, blocks 510 micrometers thick are transferred by hybridization onto a substrate using a solder balls 10 micrometers thick. The transferred blocks form CMOS detection circuits, and therefore consist mainly of Si, the substrate comprising for its part the read circuits of the detection circuits (the actual reading, compression, analog-to-digital conversion, etc,). It is required to obtain transferred blocks 10 micrometers thick.

After possibly imbedding the transferred blocks, a stop layer is deposited onto the assembly:
- using full plate deposition of a metal seed layer by sputtering or evaporation, said metal seed layer being constituted by
  - a first 50 nanometer bonding layer for example of Ti (or Cr, W or any other metal known for its bonding layer properties), and
  - a second layer of metal, deposited onto the bonding layer, 100 nanometers thick, of for example Au (or Cu, Pt, Ni or any other metal suitable for electrolysis); and
- forming the layer with the actual stop function by electrolysis of a hard metal. For example, this layer is formed of Cr (or Ni, Cu or any other metal which has both the property of being easily electrolyzable and of being harder than the material constituting the transferred blocks, in this case silicon). For example, electrolysis is applied to 19850 nanometers of this metal on the metal seed layer.

The total thickness of metal for the stop layer so obtained is therefore 20 micrometers (a 50 nanometer layer of Ti+a 100 nanometer layer of Au+a 19850 nanometer layer of Cr).

The residual thickness targeted for the transferred blocks is therefore 10 micrometers taking into account the thickness of the solder balls of 10 micrometers.

The plate so obtained is then fixed to a support and thinned using a mechanical process or a chemical process known from the prior art.

By choosing for example a speed of thinning by polishing the silicon of the transferred blocks of 50 micrometers per minute and in the further knowledge that by applying the same polishing settings to a chromium stop layer, a thinning speed is obtained of 5 micrometers per minute $$\left(\frac{V_{Si}}{V_{Cr}} = 10\right),$$

the following may be applied:
- a first thinning time chosen for removing 90% of the total thickness it is wished to remove from the transferred blocks (i.e. 90% of 500 micrometers, knowing that the transferred blocks have a thickness of 510 micrometers and that a residual thickness of 10 micrometers is required), i.e. a polishing time chosen for removing 450 micrometers. The first programmed polishing time is thus equal to 450/Vsi=450/50=9 min. At the end of said first thinning, the transferred blocks have a thickness of 50 micrometers, their surface thus being at a height of 70 micrometers from the surface of the substrate given the solder ball thickness of 10 micrometers; and
- a second polishing time, the polishing being programmed with the same settings as the polishing applied during the first period of time. This second time is chosen to be 10% more than the time required to remove the 50 micrometers remaining to be removed from the transferred blocks, in other words a second time equal to 110% of 50/Vsi=50/50=1 nm, i.e. 1.1 min.

As has previously been indicated, given the 10 times greater hardness of Cr relative to that of Si, polishing stops in reality at an altitude close to the 20 micrometers from the surface of the substrate.

In fact, the "over-attack" induced by the additional 10% of time will remove only 1 micrometer of additional silicon. The chromium layer therefore properly fulfills its stop layer function while obtaining a smoothing of the thinning over the whole surface of the blocks transferred to the substrate. The critical value of the final thickness is therefore easily attained.

The stop layer is removed in a way known per se, the attack chemistries of chromium (or nickel, copper, etc.) being conventional.

It will be noted that a thinning by chemical attack may also be programmed according to the same principle.

Likewise, an active detection of the drop in the thinning speed may also be employed. For example, the electric motor of the polishing device is torque controlled by means of a supply current. When the brush of the device meets the harder stop layer 16, the supply current is increased significantly in order to keep the torque constant. This increase in current then corresponds to the drop in the thinning speed and the detection of this current increase is used to stop the thinning.

Figure 4:
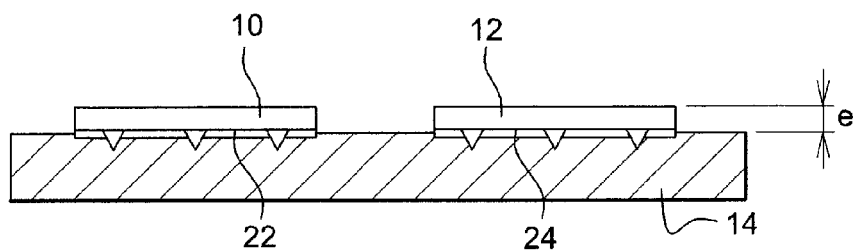
Figure 5:
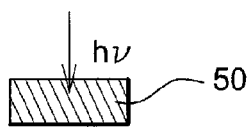
FIGS. 5 to 13 illustrate a method of manufacturing a back side illuminated matrix detector according to the invention.
Figure 6:
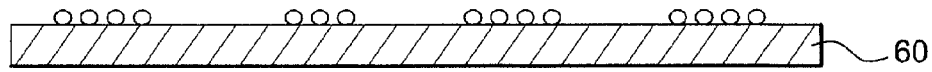
Figure 7:
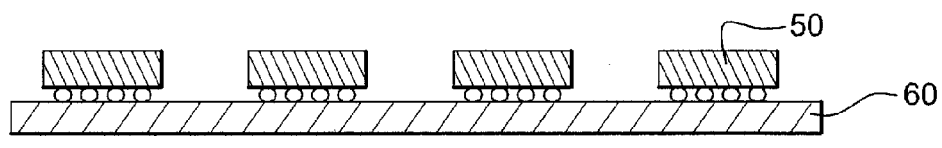

Once the thinning is finished, the stop layer 16 is then removed (FIG. 4), for example by chemically attacking it, as is well known to the man skilled in the art.

Preferentially, the stop layer 16 is selected in order to be sensitive to a selective chemical attack that does not substantially degrade the materials constituting the blocks 10, 12 and the substrate 14, which is the case when the blocks 10, 12 are made of silicon and the stop layer 16 is made of chromium, nickel or copper.

It will also be noted that the transferred blocks 10, 12 further act as a mask relative to the chemical attack used to remove the stop layer 16, thus protecting the substrate portions located underneath them. In the event of the blocks 10, 12 having been pre-imbedded prior to the strop layer 16 being deposited, the imbedding portion 22, 24 located between the blocks 10, 12 and the substrate 14 (more commonly known as "underfill") also performs this masking function. Said pre-imbedding may be constituted by a polymer resin (epoxy adhesive, silicone adhesive), and is intended to protect the components and make them reliable, and to be more precise to make said components airtight, while reducing the stresses on the junction elements.

FIGS. 5 to 12 show a method of manufacturing a back side illuminated matrix detector, or a backlit detector, that implements the inventive thinning method.

Figure 8:
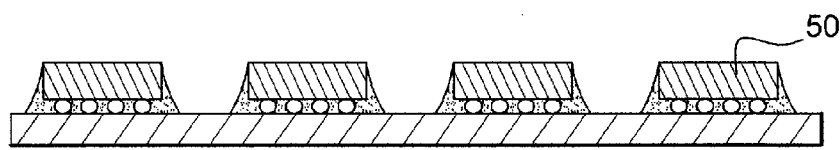
Figure 9:
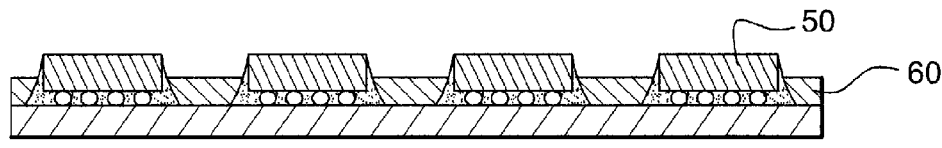
Figure 10:
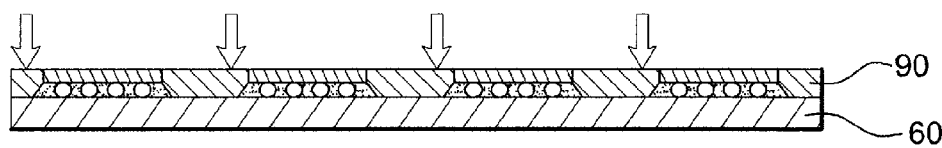

The manufacturing method starts (FIG. 5) by making a CMOS technology detection circuit 50, comprising a matrix of elementary photodetectors. A CMOS technology signal processing circuit 60 is also made (FIG. 6) and integrated into a substrate. The detection circuit 50 and the signal processing circuit 60 is then hybridized (FIG. 7) in a traditional way, for example by bonding, by a "flip-chip" technique, by a point insertion technique, or the like. The manufacturing method then continues with the imbedding of the elementary photodetectors (FIG. 8). These steps are conventional and will not be described in further detail for reasons of conciseness.

The manufacturing method then continues with the thinning of the photodetectors as described previously, namely the deposition of a stop layer 90 (FIG. 9), preferentially solely between the photodetectors, followed by lapping or polishing (FIG. 10), the thinning ending when a drop occurs in the lapping or polishing speed.

Figure 11:
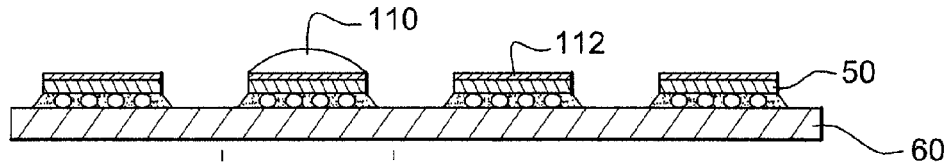
Figure 12:
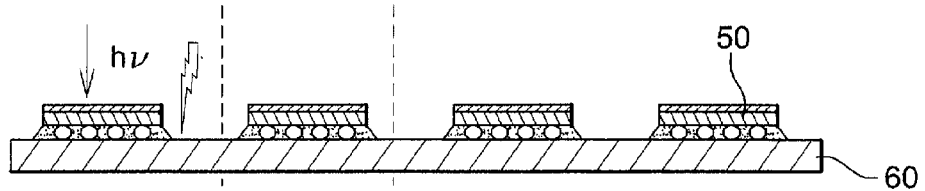

The manufacturing method then continues with the removal of the stop layer 90 by chemical attack, and a so-called "post-processing" step made possible by a small thickness of the photodetectors (FIG. 11). This step comprises in particular adding a micro-lens 110 or a colored filter 112 onto the upper face of each thinned photodetector, as is known per se. Indeed, with the photodetectors being of such small thickness, it is possible to carry out the following technological steps, such as lithography with a view to engraving filters or networks, which is not allowed by a photodetector of more substantial thickness.

Figure 13:
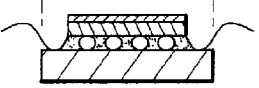

After an electro-optical test step (FIG. 12), performed for example collectively by means of a point card arranged under the signal processing circuit, the plate constituted by the photodetectors 50 hybridized with the signal processing circuit 60 is cut (FIG. 13) so that the elementary imaging circuits so obtained can be assembled in a casing.

By means of the invention, the following advantages are thus obtained:
- an accurate control of thinning; accuracy below one micrometer is thus obtained by means of the invention and residual thicknesses below 10 micrometers are attainable;
- the small amount of thinning thus achieved makes it possible to continue with a semi-conductor method. Indeed, in the prior art, to proceed to subsequent processes such as photolithography, or depositions, it is necessary to change the host carrier of the thinned assembly by virtue of the significant thickness thereof. By means of the very small thicknesses obtained by the inventive method, there is no further need to change carrier. A saving of time and material is thus achieved;
- the use of the stop layer deposited onto the substrate also acts as a protective layer thereof during the thinning. In the prior art, a protective layer is also necessary to protect the substrate during the thinning. Thus, the deposition of the stop layer does not constitute an additional step in the process of manufacturing the thinned hybridized micro-electronic components; and
- the cost of the inventive thinning is substantially reduced relative to techniques that use the incorporation of a stop layer inside the transferred blocks for thinning.

The invention claimed is:

1. A method of thinning a block transferred to a substrate, comprising:
   depositing a stop layer at least onto the substrate and in a way adjacent to and contiguous with the transferred block, said stop layer being made out of a material of greater resistance or hardness than the material constituting the transferred block and of smaller thickness than that of said transferred block; and
   actuating the thinning of the transferred block, the thinning time being pre-programmed as a function of a predetermined speed of thinning the transferred block, the thinning time being selected so that the thinning also attacks the stop layer.

2. The method of thinning a block transferred to a substrate as claimed in claim 1, wherein the stop layer is deposited by electrolytic means or by straightforward deposition, and in particular by evaporation.

3. The method of thinning a block transferred to a substrate as claimed in claim 1, wherein the step of depositing the stop layer comprises depositing a seed layer by sputtering or evaporation, followed by the electrolytic deposition onto the seed layer of a growth layer of the material of greater resistance or hardness than that of the material constituting the transferred block.

4. The method of thinning a block transferred onto a substrate as claimed in claim 1, wherein the transferred block is made out of silicon, and wherein the material of greater resistance or hardness, constituting the stop layer is a hard metal, and in particular chromium, nickel or copper, or an alloy thereof.

5. The method of thinning a block transferred onto a substrate as claimed in claim 1, wherein the stop layer comprises on its upper surface a layer made of diamond, silicon carbide or alumina.

6. The method of thinning a block transferred onto a substrate as claimed in claim 1, wherein the thinning is implemented by polishing or lapping.

7. The method of thinning a block transferred onto a substrate as claimed in claim 1, wherein the thinning is set in order to obtain a substantially constant speed of thinning the transferred block and is applied for N+M minutes, N and M being times calculated according to the relationships:

$$N = \frac{E - \Delta}{V_{Si}}$$

$$M = \frac{\Delta + \delta}{V_{Si}}$$

where $V_{Si}$ is the speed of thinning the transferred block, E is the thickness to be removed from the transferred block, $\Delta$ is a predetermined thickness much below E, and $\delta$ is a thickness much below $\Delta$.

8. The method of thinning a block transferred onto a substrate as claimed in claim 1, wherein the stop layer is also deposited onto the upper face of the transferred block, and wherein it further comprises removing the stop layer portion deposited onto the upper face of the transferred block prior to actuating the thinning of the transferred block.

9. The method of thinning a block transferred onto a substrate as claimed in claim 1, wherein the transferred block is imbedded prior to the deposition of the stop layer.

10. The method of thinning a block transferred onto a substrate as claimed in claim 1, wherein the transferred block belongs to a matrix of blocks transferred to the substrate, the stop layer being deposited at least between the blocks of the matrix, and the thinning being carried out collectively on all the blocks of the matrix.

* * * * *